(12) United States Patent
Chang

(10) Patent No.: US 7,488,996 B2
(45) Date of Patent: *Feb. 10, 2009

(54) THIN FILM TRANSISTOR ARRAY PANEL FOR A LIQUID CRYSTAL DISPLAY

(75) Inventor: Jong-Woong Chang, Suwon (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 83 days.

This patent is subject to a terminal disclaimer.

(21) Appl. No.: 11/168,886

(22) Filed: Jun. 28, 2005

(65) Prior Publication Data

US 2005/0237812 A1 Oct. 27, 2005

Related U.S. Application Data

(63) Continuation of application No. 10/915,584, filed on Aug. 9, 2004, now Pat. No. 6,919,591, and a continuation of application No. 10/359,731, filed on Feb. 6, 2003, now Pat. No. 6,774,414.

(30) Foreign Application Priority Data

Jun. 7, 2002 (KR) .............. 2002-0031803

(51) Int. Cl.
   *H01L 29/73* (2006.01)
(52) U.S. Cl. .................... 257/208; 257/210
(58) Field of Classification Search ........ 257/208, 257/210, 691, 758, 59, 72, 203, 207
   See application file for complete search history.

(56) References Cited

U.S. PATENT DOCUMENTS

| 5,754,266 | A | 5/1998 | Ohta et al. |
| 6,307,216 | B1 | 10/2001 | Huh et al. |
| 2005/0181582 | A1* | 8/2005 | You .............................. 438/479 |
| 2006/0119758 | A1* | 6/2006 | Chai et al. ..................... 349/43 |
| 2006/0176255 | A1* | 8/2006 | Do et al. ....................... 345/87 |
| 2006/0192906 | A1* | 8/2006 | Ryu et al. ...................... 349/43 |

FOREIGN PATENT DOCUMENTS

| CN | 1255740 | 6/2000 |
| JP | 04-174822 | 6/1992 |
| JP | 06-148669 | 5/1994 |
| JP | 07253596 | 3/1995 |
| JP | 08076136 | 3/1996 |
| JP | 19960011489 | 4/1996 |

(Continued)

*Primary Examiner*—S V. Clark
(74) *Attorney, Agent, or Firm*—F. Chau & Associates, LLC

(57) ABSTRACT

A plurality of gate lines formed on an insulating substrate, each gate line including a pad for connection to an external device; a plurality of data lines intersecting the gate lines and insulated from the gate lines, each data line including a pad for connection to an external device; and a conductor overlapping at least one of the gate lines and the data lines are included. An overlapping distance of the gate lines or the data lines and a width of the conductor decreases as the length of the gate lines or the data lines increases. Accordingly, the difference in the RC delays due to the difference of the length of the signal lines is compensated to be reduced.

18 Claims, 5 Drawing Sheets

FOREIGN PATENT DOCUMENTS

| | | |
|---|---|---|
| JP | 10-133218 | 5/1998 |
| JP | 11085058 | 3/1999 |
| JP | 2000056724 | 2/2000 |
| JP | 2000-111939 | 4/2000 |
| JP | 2000162628 | 6/2000 |
| KR | 1019970048819 | 7/1997 |
| KR | 1019980031762 | 7/1998 |
| KR | 1020000018577 | 4/2000 |
| KR | 1020000066953 | 11/2000 |
| KR | 1020020030699 | 4/2002 |

* cited by examiner

US 7,488,996 B2

THIN FILM TRANSISTOR ARRAY PANEL FOR A LIQUID CRYSTAL DISPLAY

CROSS-REFERENCE TO RELATED APPLICATIONS

This application is a Continuation of U.S. application Ser. No. 10/915,584 filed Aug. 9, 2004 now U.S. Pat. No. 6,919,591 and Ser. No. 10/359,731 filed on Feb. 6, 2003, and now U.S. Pat. No. 6,774,414, which claims priority to Korean Application No. 01-31803 filed on Jun. 7, 2002.

BACKGROUND OF THE INVENTION (a) Field of the Invention

The present invention relates to a thin film transistor array panel, and in particular, to a thin film transistor array panel including a fan out area provided with a connection connecting a signal line to a pad and located between a display area and a pad area.

(b) Description of the Related Art

Generally, a thin film transistor ("TFT") array panel for a liquid crystal display ("LCD") or an electro-luminescence ("EL") display is used as a circuit board for driving respective pixels in an independent manner. The TFT array panel includes a scanning signal wire or a gate wire transmitting scanning signals, an image signal wire or a data wire transmitting image signals, TFTs connected to the gate and the data wire, pixel electrodes connected to the TFTs, a gate insulating layer covering the gate wire for insulation, and a passivation layer covering the TFTs and the data wire for insulation. The TFT includes a gate electrode, which is a part of the gate wire, a semiconductor layer forming a channel, source and drain electrodes, which are parts of the data wire, a gate insulating layer, and a passivation layer. The TFT is a switching element for transmitting the image signals from the data wire to the pixel electrode in response to the scanning signals from the gate wire.

A plurality of driving integrated circuits ("ICs") are connected to the TFT array panel for applying driving signals to the gate lines and the data lines. The driving ICs are connected to the gate lines or the data lines via pads, which are clustered on a narrow area for connection to the driving ICs. On the contrary, the distances between the gate lines or the data lines on a display area are determined by the size of the pixels to have larger values than the distances between the pads. Accordingly, a fan-out area where the distances between the signal lines gradually increase is provided between the pad area and the display area. The fan-out area results in the difference in the length between the signal lines, thereby causing different RC delays between the signal lines. The difference in the RC delay causes a difference in image signals resulting in a deteriorated image quality.

SUMMARY OF THE INVENTION

In accordance with the present invention, a difference in RC delay between signal lines of a thin film transistor array panel is reduced. A conductor having a varying width depending on an overlapping length of the conductor with signal lines is provided.

According to an embodiment of the present invention, a thin film transistor array panel is provided, which includes: an insulating substrate; a plurality of gate lines formed on the insulating substrate, each gate line including a pad for connection to an external device; a plurality of data lines intersecting the gate lines and insulated from the gate lines, each data line including a pad for connection to an external device; and a conductor overlapping at least one of the gate lines and the data lines, wherein an overlapping distance of the gate lines or the data lines and a width of the conductor decreases as the length of the gate lines or the data lines increases.

Preferably, each data line includes a pad portion including the pad, a display portion, and a fan-out portion connecting the display portion and the pad portion, and width of the fan-out portion of the data line increases as length of the fan-out portion of the data line increases. Preferably, each gate line comprises a pad portion including the pad, a display portion, and a fan-out portion connecting the display portion and the pad portion, and width of the fan-out portion of the gate line increases as length of the fan-out portion of the data line increases. The conductor is preferably applied with a common electrode voltage. It is preferable that the thin film transistor array panel further includes a pixel electrode located on a pixel area defined by intersections of the gate lines and the data lines, wherein the conductor includes substantially the same layer and the same material as the pixel electrode.

The conductor may overlap the gate lines, wherein the conductor includes substantially the same layer and the same material as the data lines. The conductor may overlap the data lines, wherein the conductor includes substantially the same layer and the same material as the gate lines. The conductor may include a first conductive segment overlapping the gate lines and a second conductive segment overlapping the data lines, the first conductive segment includes substantially the same layer and the same material as the data lines, and the second conductive segment substantially the same layer and the same material as the gate lines. The conductor may be floated.

According to another embodiment of the present invention, a thin film transistor array panel is provided, which includes: an insulating substrate; a plurality of gate lines formed on the insulating substrate, each gate line including a pad for connection to an external device; a gate insulating layer formed on the gate lines; a plurality of data lines formed on the gate insulating layer and intersecting the gate lines, each data line including a pad for connection to an external device; a passivation layer formed on the data lines; and a conductor overlapping at least one of the gate lines and the data lines via at least one of the gate insulating layer and the passivation layer.

It is preferable that an overlapping distance of the gate lines or the data lines and a width of the conductor decreases as the length of the gate lines or the data lines increases. Preferably, RC delays of the gate lines are substantially the same as each other, and RC delays of the data lines are substantially the same as each other.

DETAILED DESCRIPTION OF THE PREFERRED EMBODIMENTS

Figure 1:
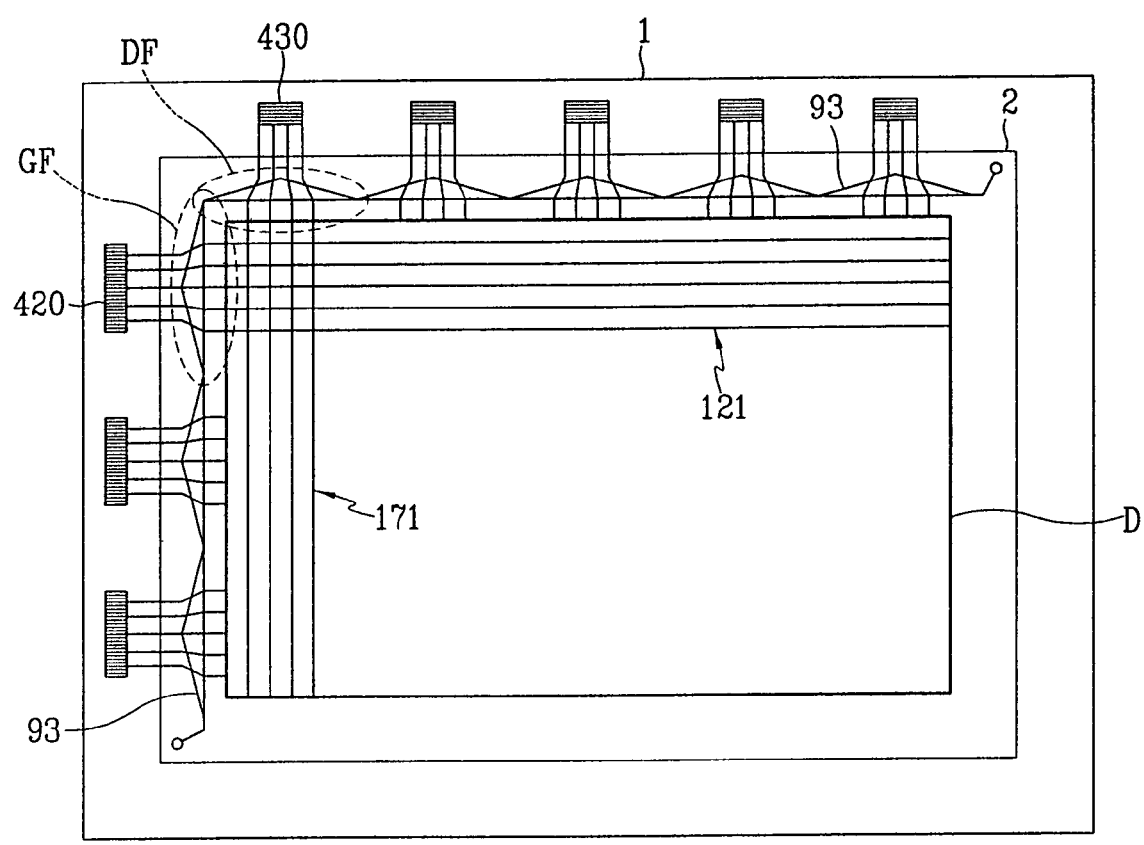
FIG. 1 is a layout view of a TFT array panel according to an embodiment of the present invention.

The present invention now will be described more fully hereinafter with reference to the accompanying drawings, in which preferred embodiments of the present invention are shown. The present invention may, however, be embodied in many different forms and should not be construed as limited to the embodiments set forth herein.

In the drawings, the thickness of layers and regions are exaggerated for clarity. Like numerals refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present.

Now, panels for liquid crystal displays (LCDs) according to embodiments of the present invention will be described in detail with reference to the accompanying drawings for one of ordinary skill in the art to easily carry out.

A TFT array panel according to an embodiment of the present invention will be described with reference to FIG. 1, which illustrates an LCD including a TFT array panel according to an embodiment of the present invention.

An LCD including a TFT array panel according to an embodiment of the present invention includes a TFT array panel 1 and a color filter array panel 2 opposite each other and a liquid crystal layer (not shown) interposed between the TFT array panel 1 and the color filter array panel 2.

Regarding the color filter array panel 2, there are provided a plurality of red, green and blue color filters (not shown), a black matrix (not shown) defining a plurality of pixel areas, and a common electrode (not shown).

The TFT array panel 1 according to an embodiment of the present invention includes a plurality of gate lines 121 extending in a transverse direction and transmitting scanning signals, a plurality of data lines 171 intersecting the gate lines 121 to define a plurality of pixel areas and transmitting image signals, a plurality of pixel electrodes (not shown) located on the pixel areas arranged in a matrix and made of transparent conductive material such as indium tin oxide ("ITO") and indium zinc oxide ("IZO") or reflective conductive material, and a plurality of TFTs (not shown) located at the intersections of the gate lines 121 and the data lines 171 and connected to the gate lines 121 and the data lines 171 to control the image signals to be applied to the pixel electrodes in response to the scanning signals.

In the meantime, the TFT array panel 1 includes a display area D for displaying images, a plurality of pad areas and a plurality of fan-out areas GF and DF located between the display area and the pad areas. The display area D includes the pixel areas defined by the intersections of the signal lines 121 and 171. Each pad area is provided with a plurality of gate pads (not shown) for transmitting the scanning signals from an external device to the gate lines 121 or a plurality of data pads (not shown) for transmitting the image signals from an external device to the data lines 171. Each fan-out area is provided for connecting the signal lines 121 and 171 to the clustered pads.

Although the color filters, the black matrix and the common electrode in this embodiment are provided on the color filter array panel 2, they may be provided on the TFT array panel 1.

The pad areas are connected to a plurality of gate driving integrated circuits ("ICs") 420 and a plurality of data driving ICs 430 mounted by out lead bonding ("OLB"). A plurality of conductors 93 are provided on the fan-out areas GF and DF and overlap the gate lines 121 or the data lines 171. The conductors 93 are connected to a common electrode voltage to reduce the RC delay due to the difference in length between the signal lines 121 and 171 on the fan-out area GF and DF. Alternatively, the conductors 93 are floated. The width of each conductor 93 varies depending on the length of the signal lines 121 and 171, e.g., the width increases as the length of the signal line 121 and 171 overlapping the conductor 93 decreases.

Fan-out areas of TFT array panels according to embodiments of the present invention will be described more in detail below.

The embodiments illustrate an exemplary chip on glass ("COG") type LCD where the gate driving ICs 420 and the data driving ICs 430 are mounted directly on the TFT array panel 1 using OLB. Alternatively, the driving ICs 420 and 430 may be mounted on a separate panel or films (e.g., tape carrier package type ("TCP")).

Figure 2:
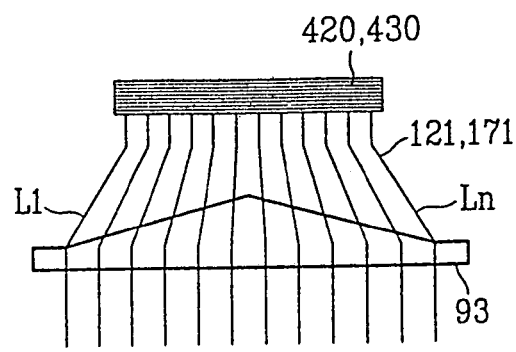
FIG. 2 is a layout view of signal lines in a fan-out area of a TFT array panel according to a first embodiment of the present invention.

FIG. 2 is a layout view of signal lines in a fan-out area of a TFT array panel according to a first embodiment of the present invention.

The width of the signal lines 121 and 171 of a TFT array panel according to a first embodiment of the present invention are equal to each other and the signal lines 121 and 171 overlap the conductor 93. The width of each conductor 93 is largest at the overlap with the shortest one among the signal lines 121 and 171 and decreases as the length of the signal lines 121 and 171 overlapping the conductor 93 increases. When a group of signal lines L1-Ln connected to one IC on the fan-out area are symmetrically arranged, the conductor 93 is the widest at the center and becomes narrow as it goes to ends.

The conductors 93 include the same layer made of a transparent conductive material such as ITO and IZO as the pixel electrodes. Alternatively, the conductors 93 are preferably made of Al alloy. The conductors 93 may include the same layer as the signal lines 121 or 171. The conductors 93 overlapping the gate lines 121 preferably include the same layer as the data lines 171, e.g., to be made of the same material as the data lines 171, while the conductors 93 overlapping the data lines 171 preferably include the same layer as the gate lines 121, e.g., to be made of the same material as the gate lines 121.

The conductors 93 are connected to the common voltage via dummy pins of ICs.

The capacitance between the conductors 93 and the signal lines compensates for the difference in resistance and capacitances between the signal lines.

Figure 3:
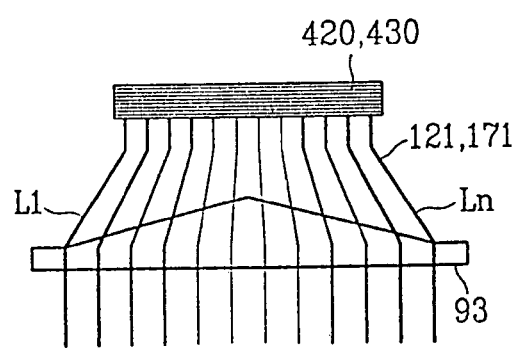
FIG. 3 is a layout view of signal lines in a fan-out area of a TFT array panel according to a second embodiment of the present invention.

FIG. 3 is a layout view of signal lines 121, 171 in a fan-out area of a TFT array panel according to a second embodiment of the present invention.

A plurality of conductors 93 overlapping signal lines 121 and 171 are provided on a TFT array panel 1 according to a second embodiment of the present invention. The width of each conductor 93 is largest at the overlap with the shortest one among the signal lines 121 and 171 and decreases as the length of the signal lines 121 and 171 overlapping the conductor 93 increases, like the first embodiment. In addition, a group of signal lines L1-Ln connected to one IC on the fan-out area are symmetrically arranged like the first embodiment.

Differently, the width of the signal lines 121 and 171 increases in proportion to their lengths. The increase of the width in proportional to the length is intended to make the resistances of the signal lines 121 and 171 equal. For example, high resistance of a signal line including a long portion on the fan-out area is compensated by this configuration. In the fan-out area having a symmetrical arrangement of the signal lines L1 and Ln connected to one IC according to this embodiment, the width of the signal lines decreases as it goes to the center while the width increases as it goes to the ends.

The RC delay becomes much more uniform by providing the conductors 93 for compensating the difference in the capacitances and by widening the signal lines 121 and 171 in proportion to their lengths for compensating the difference in the resistances.

Only the variation of the width of the signal lines without the provision of the conductor may compensate the RC delay. However, the widthwise variation is limited by practical processes such as the limitation of the distance between the signal lines due to the resolution of light exposers, the limitation of the width of the signal lines due to the etching errors, and the marginal consideration of a cutting process for cutting the substrates to separate them into a plurality of cells for LCDs. Accordingly, only the variation of the width of the signal lines without the conductor may not fully compensate the difference in the RC delay between the signal lines.

Figure 4:
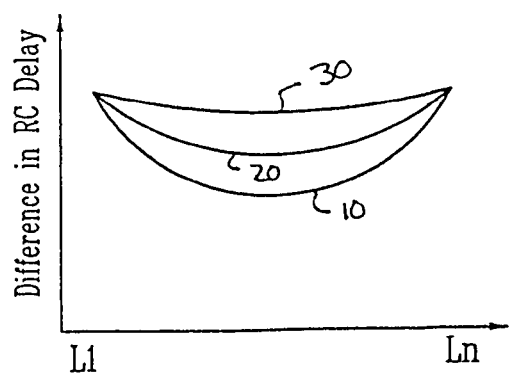
FIG. 4 is a graph illustrating the RC delays of the signal lines on the fan-out areas of the TFT array panel according to the first and the second embodiments of the present invention compared with the RC delay of a conventional TFT array panel.

FIG. 4 is a graph illustrating the RC delay of signal lines on a fan-out area of a TFT array panel according to the first and the second embodiments of the present invention compared with the RC delay of a conventional TFT array panel. The abscissa of FIG. 4 indicates the positions of the signal lines connected to one IC. For example, L1 and Ln indicate the leftmost and the rightmost signal lines, respectively.

The lowermost curve 10 shown in FIG. 4 represents the RC delay of the signal lines of a conventional TFT array panel without any compensation for RC delay. The intermediate curve 20 represents the RC delay of the signal lines of a TFT array panel with conductors 93 according to the first embodiment. The uppermost curve 30, which is nearly a straight line, represents the RC delay of the signal lines with different widths of a TFT array panel with conductors 93 according to the second embodiment.

FIG. 4 suggests that the provision of the conductors 93 and the variation of the line width of the signal lines make the RC delay uniform.

Figure 5:
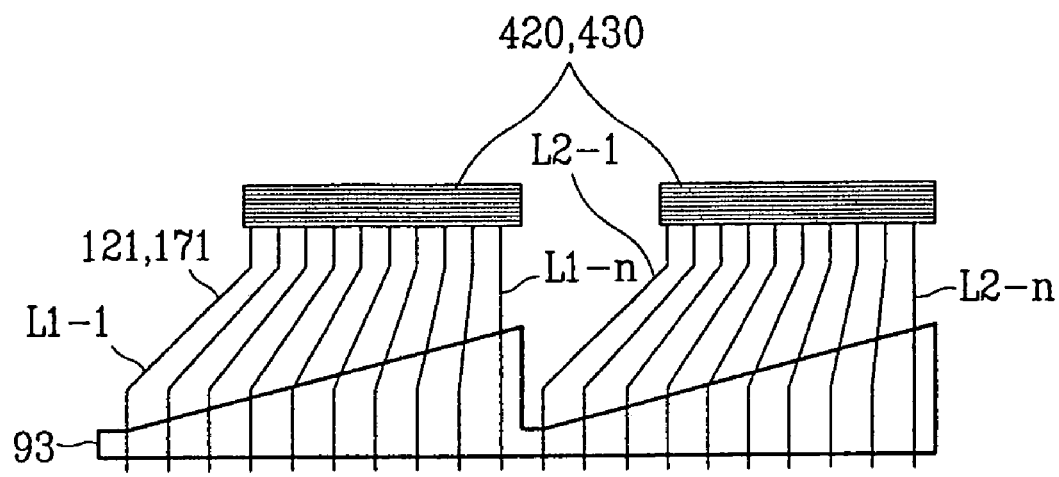
FIG. 5 is a layout view of signal lines in a fan-out area of a TFT array panel according to a third embodiment of the present invention.

FIG. 5 is a layout view of signal lines 121, 171 in a fan-out area of a TFT array panel according to a third embodiment of the present invention.

According to the third embodiment, the arrangement of the signal lines 121 and 171 connected to one IC 420, 430 on the fan-out area are asymmetrical. However, a rule that the width of the conductor 93 decreases as the length of the signal lines 121 and 171 overlapping the conductor 93 increases is also applied to this embodiment like the first embodiment. Under this rule, the conductor 93 has various shapes depending on the arrangement of the signal lines 121 and 171 on the fan-out area.

Figure 6:
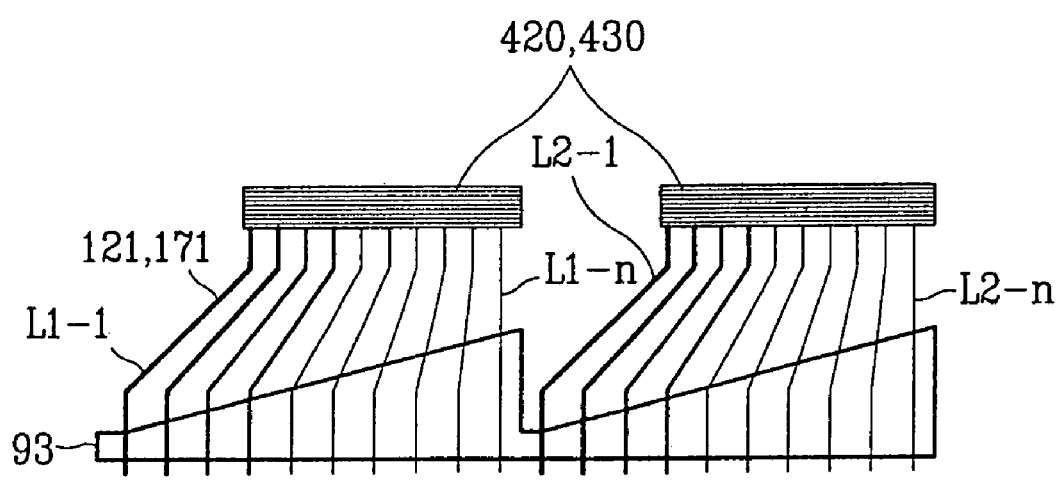
FIG. 6 is a layout view of signal lines in a fan-out area of a TFT array panel according to a fourth embodiment of the present invention.

FIG. 6 is a layout view of signal lines 121, 171 in a fan-out area of a TFT array panel according to a fourth embodiment of the present invention.

According to the fourth embodiment, the arrangement of the signal lines 121 and 171 connected to one IC 420, 430 on the fan-out area are asymmetrical. However, a rule that the width of the conductor 93 decreases as the length of the signal lines 121 and 171 overlapping the conductor 93 increases and the width of the signal lines 121 and 171 increases in proportion to their length is also applied to this embodiment like the second embodiment. Under this rule, the conductor 93 has various shapes depending on the arrangement of the signal lines 121 and 171 on the fan-out area.

Figure 7A:
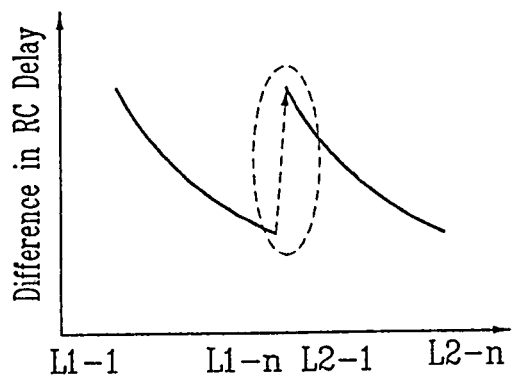
FIG. 7A is a graph illustrating the RC delay of the signal lines on the fan-out areas of a conventional TFT array panel.
Figure 7B:
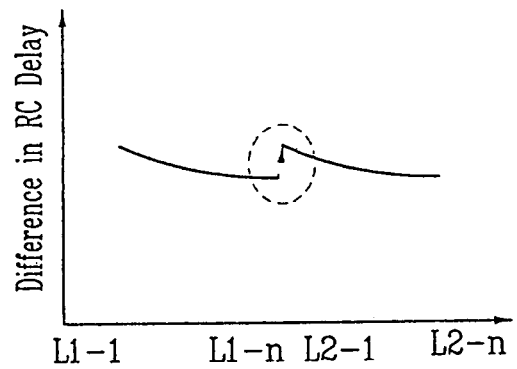
FIG. 7B is a graph illustrating the RC delay of the signal lines on the fan-out areas of a TFT array panel according to the third embodiment of the present invention.
Figure 7C:
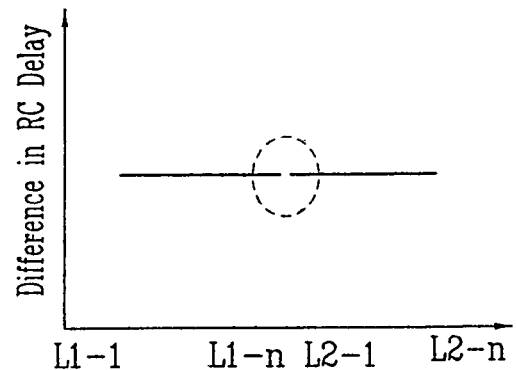
FIG. 7C is a graph illustrating the RC delay of the signal lines on the fan-out areas of a TFT array panel according to the fourth embodiment of the present invention.

FIG. 7A is a graph illustrating the RC delay of the signal lines on the fan-out areas of a conventional TFT array panel, FIG. 7B is a graph illustrating the RC delay of the signal lines on the fan-out areas of a TFT array panel according to the third embodiment of the present invention, and FIG. 7C is a graph illustrating the RC delay of the signal lines on the fan-out areas of a TFT array panel according to the fourth embodiment of the present invention.

As shown in FIG. 7A, the extreme variation of the RC delay deteriorates the image quality since the discontinuity in the RC delay appears as a discontinuous line on a screen. As shown in FIGS. 7B and 7C, the provision of the conductors 93 and the variation of the line width of the signal lines make the RC delay uniform, thereby preventing the deterioration of the image quality.

Now, cross-sections of fan-out areas according to embodiments of the present invention will be described with reference to the drawings.

Figure 8:
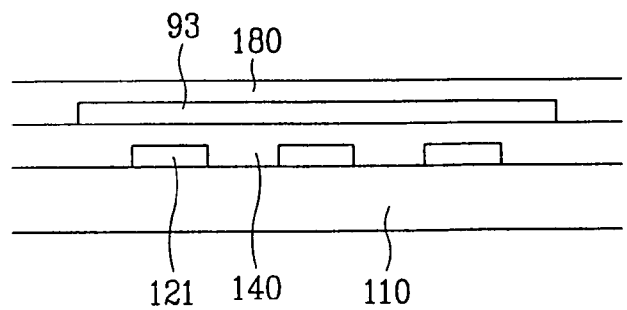
FIG. 8 is a sectional view of signal lines on a gate fan-out area of a TFT array panel according to a fifth embodiment of the present invention.

FIG. 8 is a sectional view of signal lines on a gate fan-out area of a TFT array panel according to a fifth embodiment of the present invention.

A plurality of gate lines 121 is formed on an insulating substrate 110, and a gate insulating layer 140 is formed on the gate lines 121. A conductor 93 made of the same material as data lines (not shown) is formed on the gate insulating layer 140, and a passivation layer 180 is formed on the conductor 93. A plurality of pixel electrodes (not shown) are formed on the passivation layer 180.

Figure 9:
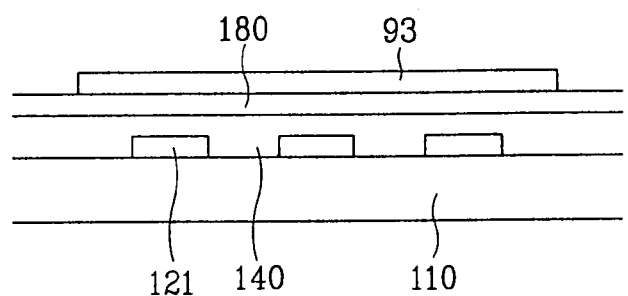
FIG. 9 is a sectional view of signal lines on a gate fan-out area of a TFT array panel according to a sixth embodiment of the present invention.

FIG. 9 is a sectional view of signal lines on a gate fan-out area of a TFT array panel according to a sixth embodiment of the present invention.

Different from the fifth embodiment, a conductor 93 made of the same material as pixel electrodes (not shown) is formed on a passivation layer 180.

Figure 10:
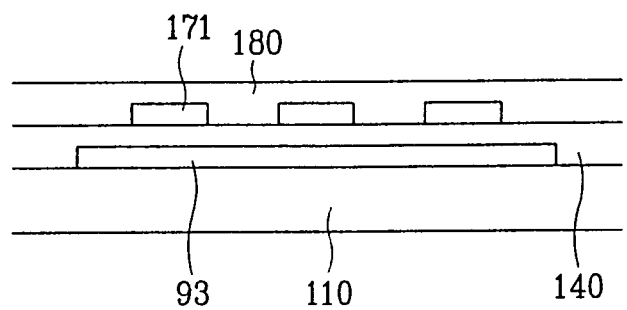
FIG. 10 is a sectional view of signal lines on a data fan-out area of a TFT array panel according to a seventh embodiment of the present invention.

FIG. 10 is a sectional view of signal lines on a data fan-out area of a TFT array panel according to a seventh embodiment of the present invention.

A conductor 93 made of the same material as gate lines (not shown) is formed on an insulating substrate 110, and a gate insulating layer 140 is formed on the conductor 93 and the gate lines. A plurality of data lines 171 is formed on the gate insulating layer 140, and a passivation layer 180 is formed on the data lines 171. A plurality of pixel electrodes (not shown) are formed on the passivation layer 180.

Figure 11:
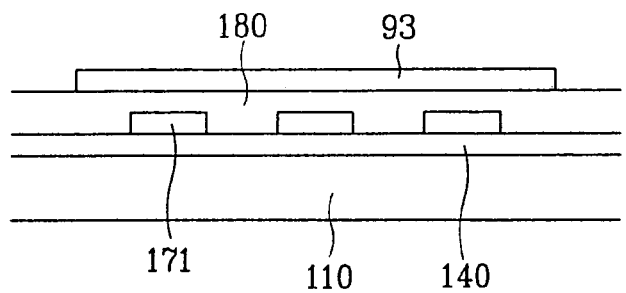
FIG. 11 is a sectional view of signal lines on a data fan-out area of a TFT array panel according to an eighth embodiment of the present invention.

FIG. 11 is a sectional view of signal lines on a data fan-out area of a TFT array panel according to an eighth embodiment of the present invention.

Different from the seventh embodiment, a conductor 93 made of the same material as pixel electrodes (not shown) is formed on a passivation layer 180.

According to the present invention, the difference in the RC delays due to the different lengths of signal lines on a fan-out area of a TFT array panel is compensated for by providing a conductor and differentiating the width of the signal lines.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A thin film transistor array panel comprising:
   an insulating substrate;
   a plurality of gate lines formed on the insulating substrate, each gate line including a pad for connection to an external device;
   a plurality of data lines intersecting the gate lines and insulated from the gate lines, each data line including a pad for connection to an external device; and
   a plurality of conductors respectively overlapping at least one of the gate lines and the data lines,
   wherein capacitance between the gate lines or the data lines and the conductors decreases as a length of the gate lines or the data lines increases.

2. The thin film transistor array panel of claim 1, wherein each data line comprises a pad portion including the pad, a display portion and a fan-out portion connecting the display portion and the pad portion, and resistance per unit length of the fan-out portion of the data line decrease as a length of the fan-out portion of the data line increases.

3. The thin film transistor array panel of claim 1, wherein each gate line comprises a pad portion including the pad, a display portion and a fan-out portion connecting the display portion and the pad portion, and resistance per unit length of the fan-out portion of the gate line decrease as a length of the fan-out portion of the gate line increases.

4. The thin film transistor array panel of claim 1, wherein the conductors are applied with a reference voltage.

5. The thin film transistor array panel of claim 1, further comprising a pixel electrode located on a pixel area defined by intersections of the gate lines and the data lines, wherein the conductors are formed substantially in a same layer and of a same material as the pixel electrode.

6. The thin film transistor array panel of claim 1, wherein the conductors overlap the gate lines, wherein the conductors are formed substantially in a same layer and of a same material as the data lines.

7. The thin film transistor array panel of claim 1, wherein the conductors overlap the data lines, wherein the conductors are formed substantially in a same layer and of a same material as the gate lines.

8. The thin film transistor array panel of claim 1, wherein the conductors include first conductive segments overlapping the gate lines and second conductive segments overlapping the data lines, the first conductive segments are formed substantially in a same layer and of a same material as the data lines, and the second conductive segments are formed substantially in a same layer and of a same material as the gate lines.

9. The thin film transistor array panel of claim 1, wherein the conductors are floated.

10. A thin film transistor array panel comprising:
    an insulating substrate;
    a plurality of gate lines formed on the insulating substrate, each gate line including a pad for connection to an external device;
    a plurality of data lines intersecting the gate lines and insulated from the gate lines, each data line including a pad for connection to an external device; and
    a plurality of conductors respectively overlapping at least one of the gate lines and the data lines,
    wherein overlapping area between the gate lines or the data lines and the conductors decreases as a length of the gate lines or the data lines increases.

11. The thin film transistor array panel of claim 10, wherein each data line comprises a pad portion including the pad, a display portion and a fan-out portion connecting the display portion and the pad portion, and resistance per unit length of the fan-out portion of the data line decrease as a length of the fan-out portion of the data line increases.

12. The thin film transistor array panel of claim 10, wherein each gate line comprises a pad portion including the pad, a display portion and a fan-out portion connecting the display portion and the pad portion, and resistance per unit length of the fan-out portion of the gate line decrease as a length of the fan-out portion of the gate line increases.

13. The thin film transistor array panel of claim 10, wherein the conductors are applied with a reference voltage.

14. The thin film transistor array panel of claim 10, further comprising a pixel electrode located on a pixel area defined by intersections of the gate lines and the data lines, wherein the conductors are formed substantially in a same layer and of a same material as the pixel electrode.

15. The thin film transistor array panel of claim 10, wherein the conductors overlap the gate lines, wherein the conductors are formed substantially in a same layer and of a same material as the data lines.

16. The thin film transistor array panel of claim 10, wherein the conductors overlap the data lines, wherein the conductors are formed substantially in a same layer and of a same material as the gate lines.

17. The thin film transistor array panel of claim 10, wherein the conductors include first conductive segments overlapping the gate lines and second conductive segments overlapping the data lines, the first conductive segments are formed substantially in a same layer and of a same material as the data lines, and the second conductive segments are formed substantially in a same layer and of a same material as the gate lines.

18. The thin film transistor array panel of claim 10, wherein the conductors are floated.

* * * * *